United States Patent
Chang et al.

(10) Patent No.: US 6,479,891 B2
(45) Date of Patent: Nov. 12, 2002

(54) INCORRECT-PLACEMENT PREVENTING DIRECTIONAL IC TRAY FOR CARRYING IC PACKAGES

(75) Inventors: Wen-Yuan Chang, Taipei (TW); Ming-Ren Chi, Hsinchu (TW)

(73) Assignee: VIA Technologies, Inc., Taipei (TW)

( * ) Notice: Subject to any disclaimer, the term of this patent is extended or adjusted under 35 U.S.C. 154(b) by 0 days.

(21) Appl. No.: 09/973,080

(22) Filed: Oct. 10, 2001

(65) Prior Publication Data

US 2002/0070435 A1 Jun. 13, 2002

(30) Foreign Application Priority Data

Dec. 13, 2000 (TW) .......................................... 89221664

(51) Int. Cl.[7] .............................................. H01L 23/02
(52) U.S. Cl. ....................................... 257/678; 257/685
(58) Field of Search .................................. 257/685, 678, 257/697, 713, 723, 731, 737, 20, 24, 190, 194, 201, 192, 734; 438/191, 113, 33, 68, 458, 106, 121

(56) References Cited

U.S. PATENT DOCUMENTS

| | | | | | |
|---|---|---|---|---|---|
| 5,103,976 A | * | 4/1992 | Murphy | ........................ | 206/509 |
| 5,731,230 A | * | 3/1998 | Nevill et al. | ................... | 438/15 |
| 5,890,599 A | * | 4/1999 | Murphy | ........................ | 206/725 |
| 6,337,227 B1 | * | 1/2002 | Ball | ............................ | 438/113 |
| 6,354,481 B1 | * | 3/2002 | Rich et al. | ................... | 134/105 |
| 6,372,527 B1 | * | 4/2002 | Khandros et al. | ........... | 438/113 |
| 2002/0011663 A1 | * | 1/2002 | Khandros et al. | ........... | 257/734 |

* cited by examiner

*Primary Examiner*—Hoai Ho
*Assistant Examiner*—Long K. Tran
(74) *Attorney, Agent, or Firm*—Rabin & Berdo, PC

(57) ABSTRACT

An IC tray for carrying IC packages that prevents incorrect placement of IC packages is provided. The tray includes a number of IC cavities used to accommodate the IC packages, with each of the IC packages having been provided with the second direction indicator that corresponds to the first direction indicator that each of the IC cavity has, preventing the IC packages from being placed into the IC tray in wrong directions. The IC tray prevents the users or operators from placing the IC packages into it in wrong directions, therefore effectively improves the convenience and yield rate in the subsequent manufacturing processes.

20 Claims, 3 Drawing Sheets

INCORRECT-PLACEMENT PREVENTING DIRECTIONAL IC TRAY FOR CARRYING IC PACKAGES

This application incorporates by reference Taiwanese application Ser. No. 89221664, Filed on Dec. 13, 2000.

BACKGROUND OF THE INVENTION

1. Field of the Invention

The invention relates in general to a tray for carrying Integrated Circuit Packages (IC packages) and more particularly to an Integrated Circuit Tray (IC tray) that prevents operators from placing IC packages in wrong directions.

2. Description of the Related Art

In the development of the IC packaging technology, area packages such as the Ball Grid Array (BGA), Flip Chips (FC), Land Grid Area (LGA) and Pin Grid Array (PGA) are the existing package types with great potential in future development. Of all the area packages mentioned above, BGA, LGA and PGA belong to Type Grid Area (Type GA). The conventional way to ship the above-mentioned IC packages, take the PGA IC package for instance, is to place them in an IC tray. As shown in FIG. 1, a top-view of a conventional IC tray for carrying IC packages is illustrated. In addition, the IC tray disclosed complies with the standard industrial specifications according to the Joint Electronic Device Engineering Council (JEDEC) and is therefore called the JEDEC tray.

Referring to FIG. 1, an IC tray 100 with a number of IC cavities 102 is illustrated. Each of the IC cavities 102, having a square opening 104 with a separator 105 located on it, accommodates an IC package (not shown here). The separator 105 can be a square shaped one like the separator 106 and/or an X-shaped one like the separator 108. The X-shaped separator 108 can be situated within the square shaped separator 106 and thus the two types of separators are integrated into one.

The above-mentioned separator 105 is used to prevent operators from touching the pins at the bottom of the IC package. For example, during the manufacturing process of IC packaging, the IC packages in the IC tray need to be displaced if they were found to have any problem by the operator or if power off occurred. Since the conventional IC tray lacks of directional design, the operator can only rely on the direction of letters or the directional index of the IC package to determine the direction of placement. Therefore the IC packages are likely to be placed in wrong directions resulting in wasted time and difficulties in the subsequent manufacturing processes.

SUMMARY OF THE INVENTION

It is therefore an object of the invention to provide a wrong-direction preventing directional IC tray for carrying IC packages that prevents the users or operators from placing the IC packages into it in wrong directions, therefore effectively improves the convenience and yield rate in the subsequent manufacturing processes.

According to the object of the invention, a directional IC tray for carrying IC packages is provided. The directional IC tray includes a number of IC cavities for accommodating and orientating a number of IC packages in position by using directional designs. Each IC cavity has the first direction indicator corresponding to the second direction indicator of the IC package. As a consequence, incorrect placement of IC packages can be avoided.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
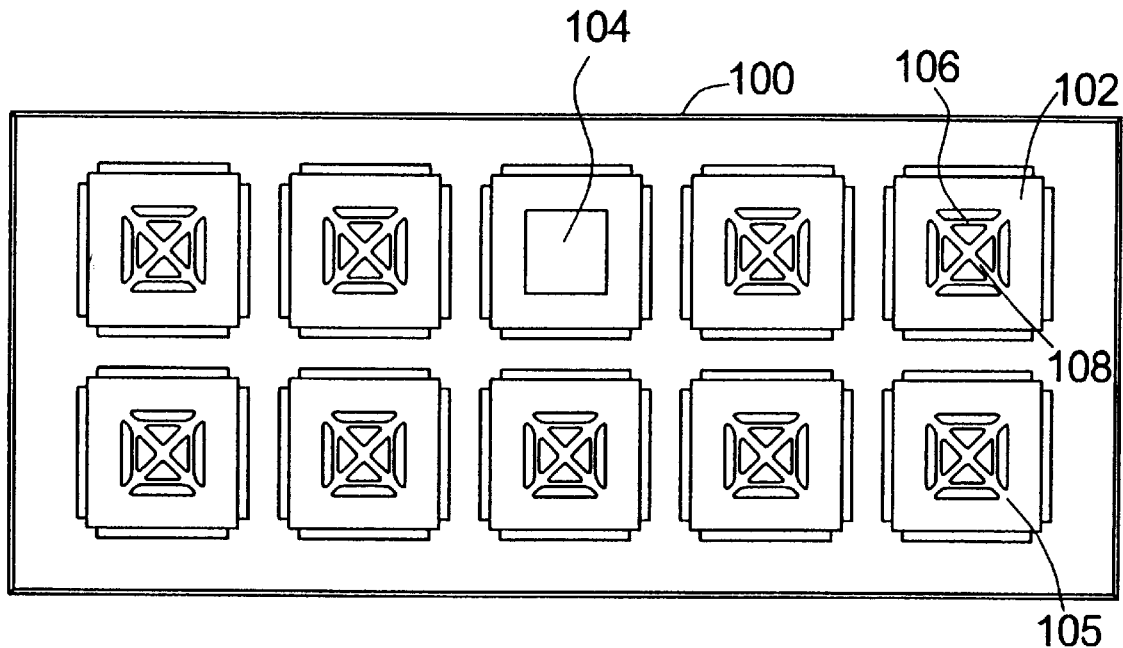
FIG. 1 (prior art) is a top view of a conventional IC tray for carrying IC packages.
Figure 2:
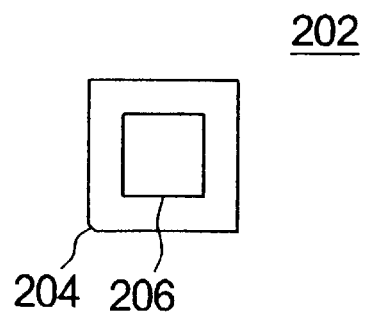
FIG. 2 is a top view of an IC package.

Normally the IC package provides the user or operator a design, which facilitates them to identify the direction of placement. Although the top view structures of IC packages are normally either square or oblong, according to the present invention one of the four corners can be chamfered to facilitate users or operators to identify the correct direction for the placement of IC packages. Referring to FIG. 2, a top view of an IC package, wherein the IC package 202 has a chamfer. For instance, the chamfer 204 is at the left lower corner of the IC package 202 as shown in FIG. 2. The chamfer 204 is circular arced.

Figure 3A:
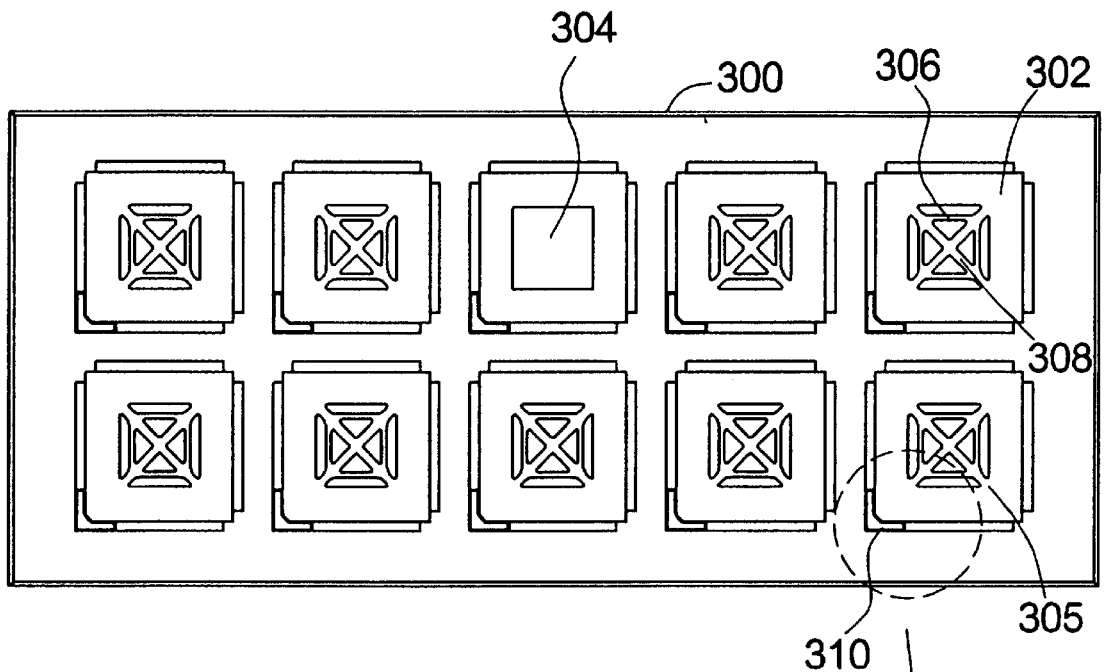
FIG. 3A is a top view of an IC tray for carrying IC packages according to a preferred embodiment of the invention.

Referring to FIG. 3A, a top view of an IC tray for carrying IC packages according to a preferred embodiment of the invention is shown, wherein the IC tray 300 has a number of IC cavities 302. Each of the IC cavities 302, having a square opening 304 with a separator 305 located on it, accommodates an IC package (not shown here). The separator 305 can be a square shaped one like the separator 306 and/or an X-shaped one like the separator 308. The X-shaped separator 308 can be situated within the square shaped separator 306 and thus the two types of separators are integrated into one. The above-mentioned separator 305 is used to prevent operators from touching the contacting means 206 at the bottom of the IC package 202. The contacting means 206 can have several pins, balls or pads. Whether the IC tray 302 needs a separator 305 depends on its requirements.

Figure 3B:
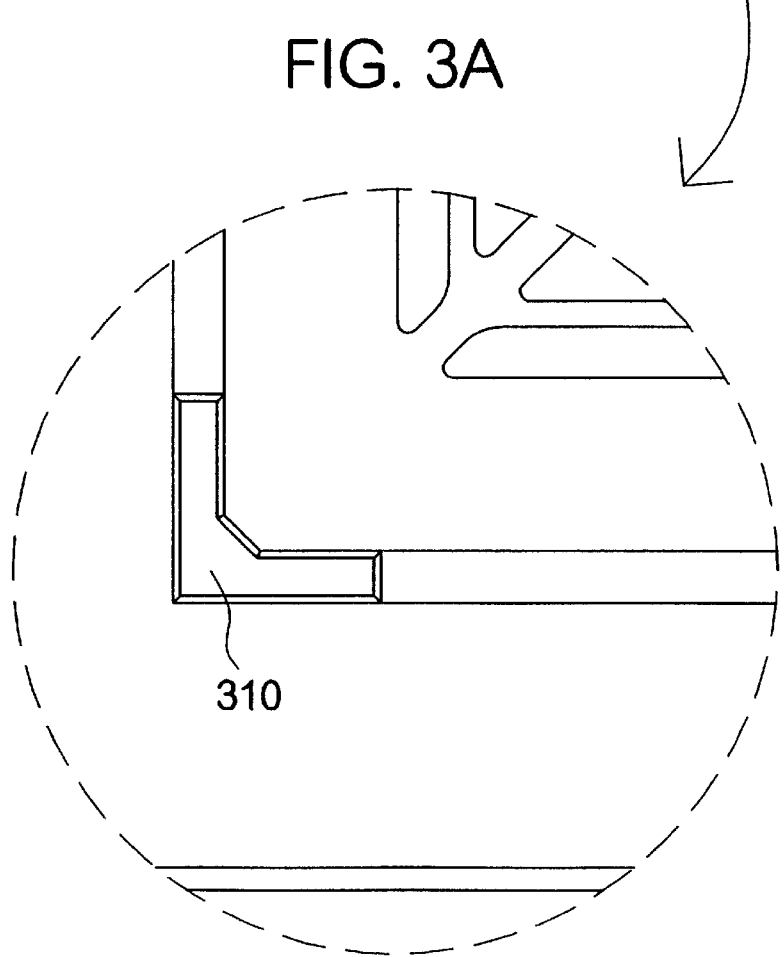
FIG. 3B is an enlarged top view of an area IC cavity in FIG. 3A.

Please refer to FIG. 3B, an enlarged top view of an area IC cavity in FIG. 3A is shown. In the invention, the IC cavity 302 is designed to have a bump, such as the chamfer bump 310 as in FIG. 3B, corresponding to the chamfer design. The chamfer 204 of the IC package 202 for instance, when placing the IC package 202 into the IC cavity 302, the operator needs to take into consideration the directional indicator of the IC package 202. That is, the chamfer 204 at the left lower corner of the IC package 202 must match with the chamfer bump 310 of the IC cavity 302. Otherwise, if the IC package 202 is placed in wrong directions, one of the corners of the IC package 202 will be obstructed by the chamfer bump 310 of the IC tray 310. The IC package 202 cannot be smoothly placed into the IC cavity 302, nor can the IC trays 300 be stacked properly. Thus the operator will be warned of the mistake and correct it accordingly.

Figure 3C:
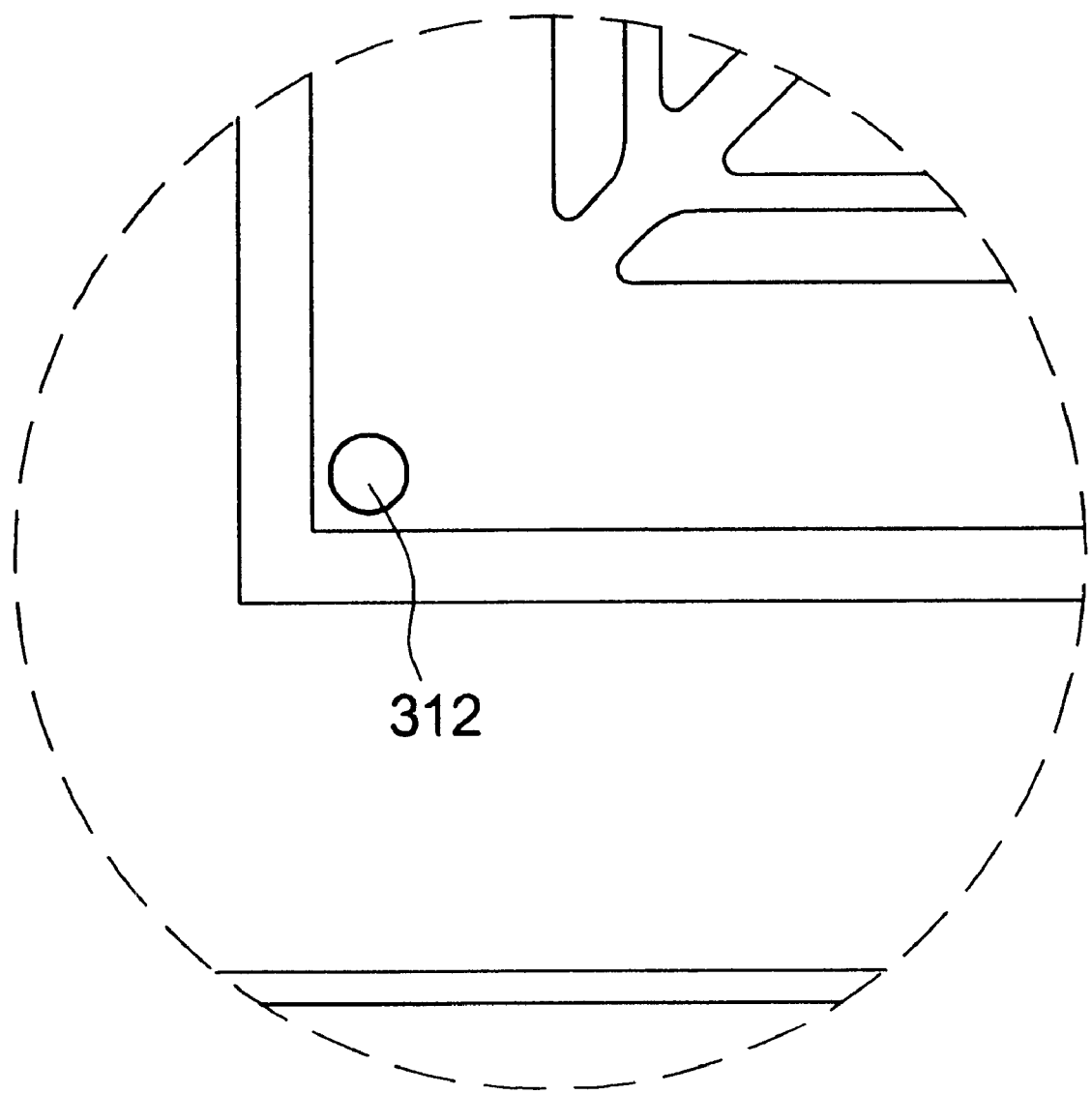
FIG. 3C is an enlarged top view of an area IC cavity in FIG. 3B, wherein the bump is a cylinder.

For anyone who is familiar with the skill and technology, the chamfer of the IC package 202 can be of varied designs. As shown in FIG. 3C, the bump 310 of the IC cavity 302 is a cylinder 312. The IC cavity 302 can also have other corresponding designs to prevent the IC packages 202 from being placed into the IC cavity 302 in wrong directions. Therefore, the shape, size, number, and location of the bump of the IC cavity 302 have to correspond with that of the IC package 202, such that the IC package 202 will not be placed into the IC tray 300 in wrong directions.

Of which, the IC tray disclosed complies with the standard industrial specifications according to the Joint Electronic Device Engineering Council (JEDEC) and is therefore called the JEDEC tray. In addition, the IC package 202 which is applied to the invention can be area IC packages such as the IC of Chip Scale Package (CSP), Ball Grid Array (BGA) Package, Flip Chip (FC) Package, Land Grid Area (LGA) Package and Pin Grid Array (PGP) Package in kind of all the IC packages mentioned above, BGA, LGA and PGA belong to Type GA.

The IC tray disclosed in the invention prevents incorrect placement of IC packages by designing the corresponding outlook of the IC cavity according to the shape of the IC package. Therefore incorrect placement of IC packages can be prevented, the convenience and yield rate in the subsequent manufacturing processes improved.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An Integrated Circuit Tray (IC tray) arrangement, comprising:
    a plurality of IC packages, each having a position indicator; and
    an IC tray having a plurality of IC cavities, each being adapted to receive a respective one of the IC packages therein, each cavity having a direction indicator for accommodating and orientating the position indicator of the respective IC package so that the IC packages can only be placed into the respective cavities of the IC tray in a predefined orientation.

2. The IC tray arrangement of claim 1, wherein the direction indicator comprises a bump in the IC cavity.

3. The IC tray arrangement of claim 2, wherein the bump is a cylinder.

4. The IC tray arrangement of claim 1, wherein the position indicator comprises a chamfer.

5. The IC tray arrangement of claim 4, wherein the chamfer is circular arced.

6. The IC tray arrangement of claim 1, wherein the IC cavity comprises:
    a separator located on an opening of the IC cavity, wherein the separator prevents contacting means at the bottom of the IC package from being touched.

7. The IC tray arrangement of claim 6, wherein the separator is square shaped.

8. The IC tray arrangement of claim 6, wherein the separator is X-shaped.

9. The IC tray arrangement of claim 6, wherein the contacting means has a plurality of pins.

10. The IC tray arrangement of claim 6, wherein the contacting means has a plurality of balls.

11. The IC tray arrangement of claim 6, wherein the contacting means has a plurality of pads.

12. The IC tray arrangement of claim 1, wherein the IC package is an area IC.

13. The IC tray arrangement of claim 1, wherein the IC package is a Grid Area (GA) IC.

14. The IC tray arrangement of claim 1, wherein the IC package is a Flip Chip (FC) IC.

15. The IC tray arrangement of claim 1, wherein the IC package is a Chip Scale Package (CSP) IC.

16. The IC tray arrangement of claim 1, wherein the IC tray is a Joint Electronic Device Engineering Council Tray (JEDEC tray).

17. An Integrated Circuit Tray (IC tray), comprising:
    a plurality of IC cavities having orientating means for physically preventing a plurality of IC packages stored in the IC cavities from being placed into the IC tray in wrong directions.

18. The IC tray of claim 17, wherein the orientating means of the IC cavity is a bump corresponding to a chamfer of the IC package.

19. The IC tray of claim 18, wherein the bump is a cylinder.

20. The IC tray of claim 18, wherein the chamfer is circular arced.

* * * * *